United States Patent [19]

Tamagawa et al.

[11] Patent Number: 4,876,170

[45] Date of Patent: Oct. 24, 1989

[54] LIGHT-SENSITIVE MATERIAL COMPRISING LIGHT-SENSITIVE LAYER CONTAINING MICROCAPSULES PROVIDED ON SPECIFIC PAPER SUPPORT

[75] Inventors: Shigehisa Tamagawa, Shizuoka; Masayuki Kuroishi, Kanagawa; Tetsuro Fuchizawa, Shizuoka, all of Japan

[73] Assignee: Fuji Photo Film Co., Ltd., Kanagawa, Japan

[21] Appl. No.: 136,575

[22] Filed: Dec. 22, 1987

[30] Foreign Application Priority Data

Dec. 22, 1986 [JP] Japan .................. 61-307206
Apr. 6, 1987 [JP] Japan .................. 62-84113

[51] Int. Cl.$^4$ .................. G03C 1/87; G03C 1/72
[52] U.S. Cl. .................. 430/138; 430/203; 430/538
[58] Field of Search .............. 430/138, 203, 253, 254, 430/538; 428/537.1, 537.5

[56] References Cited

U.S. PATENT DOCUMENTS

| | | | |
|---|---|---|---|
| 4,440,846 | 4/1984 | Sanders et al. | 430/138 |
| 4,482,628 | 11/1984 | Katsura et al. | 430/538 |
| 4,629,676 | 12/1986 | Hayakawa et al. | 430/203 |
| 4,649,098 | 3/1987 | Takeda | 430/270 |
| 4,713,312 | 12/1987 | Adair et al. | 430/138 |
| 4,728,631 | 3/1988 | Ogata et al. | 503/200 |

FOREIGN PATENT DOCUMENTS 203613 12/1966 European Pat. Off. .......... 430/138

OTHER PUBLICATIONS

JIS -P14 8207, "Method of Screening Test of Paper Pulp," 1976, Jaramzsie Standards Association, pp. 45.
Toyo Seiki Seis Aku-SHO, Ltd. "Sheet Formation Tester," 10/83.

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprises a light-sensitive layer containing silver halide, a reducing agent and a polymerizable compound provided on a paper support. Another light-sensitive material comprises a light-sensitive layer containing a photo polymerizable composition or a photo polymerizable compound provided on a paper support. The paper support employs a base paper sheet having such distribution of formation that the total coefficient of variation relating to the distribution curve of laser beam transmittance is not more than 15%. The distribution curve of laser beam transmittance is obtained by helium-neon laser scanning.

22 Claims, No Drawings

LIGHT-SENSITIVE MATERIAL COMPRISING LIGHT-SENSITIVE LAYER CONTAINING MICROCAPSULES PROVIDED ON SPECIFIC PAPER SUPPORT

BACKGROUND OF THE INVENTION

1. Field of the invention

This invention relates to a light-sensitive material comprising a light-sensitive layer containing silver halide, a reducing agent and a polymerizable compound provided on a support. This invention also relates to a light-sensitive material comprising a light-sensitive layer containing a photo polymerizable composition or a photo polymerizable compound provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

Another light-sensitive material comprising a light-sensitive layer containing a photo polymerizable composition or a photo polymerizable compound provided on a support is employed for an image-forming method, which comprises imagewise exposing the light-sensitive material to form a polymer within the exposed area. The light-sensitive material and the image-forming method are described in Japanese Patent Provisional Publication Nos. 52(1977)-89915, 57(1982)-179836, 58(1983)-88740 (corresponding to U.S. Pat. No. 4,440,846) and 60(1985)-259490 (corresponding to U.S. Pat. No. 4,554,235).

Further, Japanese Patent Provisional Publication Nos. 61(1986)-73145, 58(1983)-88739 (corresponding to U.S. Pat. No. 4,399,209), 58(1983)-88740 and 60(1985)-259490 describe embodiments of the above-stated image forming methods, which comprise imagewise forming a polymer on the light-sensitive material, and pressing the light-sensitive material on an image-receiving material to transfer unpolymerized polymerizable compound (the term, "polymerizable compound" hereinafter sometimes includes the photo polymerizable composition and photo polymerizable compound) to the image-receiving material. In the image-forming method including the image transfer process, the components of the light-sensitive layer, such as silver halide, reducing agent and polymerizable compound are preferably contained in microcapsules which are dispersed in the light-sensitive layer.

As the support for the above-mentioned light-sensitive materials, a paper is sometimes employed, because a paper is disposable, lightweight and easy to handle.

SUMMARY OF THE INVENTION

According to study of the present inventors, a paper support sometimes shows certain unfavorable behavior in the above-stated image-forming method. In more detail, in the case that the unpolymerized polymerizable compound is transferred from the light-sensitive material employing a paper support to the image-receiving material, low optical density spots containing only an extremely small amount of the polymerizable compound are sometimes formed on the image-receiving material within the area where a sufficient amount of the polymerizable compound should be transferred. For example, the low optical density spots having a relatively large diameter of not less than 1 mm are observed when the image is transferred to the image-receiving material under relatively low pressure. The low optical density spots are also observed within the area where the original density is relatively high when the original has a gradation, even if the image is transferred under high pressure.

An object of the present invention is to provide a light-sensitive material employing a paper support which is minimized or reduced in occurrence of the low optical density spots in the image formation.

There is provided by the present invention a light-sensitive material comprises a light-sensitive layer containing silver halide, a reducing agent and a polymerizable compound provided on a paper support, wherein the paper support employs a base paper sheet having such a distribution of formation that the total coefficient of variation relating to the distribution curve of laser beam transmittance is not more than 15%, said distribution curve of laser beam transmittance is obtained by scanning a helium-neon laser.

There is also provided by the invention a light-sensitive material comprises a light-sensitive layer containing a photo polymerizable composition or a photo polymerizable compound provided on a paper support, wherein the paper support employs a base paper sheet having such a distribution of formation that the total coefficient of variation relating to the distribution curve of laser beam transmittance is not more than 15%, said distribution curve of laser beam transmittance is obtained by helium-neon laser scanning.

In the present invention, the effect is remarkable in the embodiment wherein the silver halide and polymerizable compound are contained in microcapsule, or the embodiment wherein the photo polymerizable composition or photo polymerizable compound are contained in microcapsule.

The light-sensitive material of the present invention is characterized in that the paper support employs a base paper sheet having the above-defined distribution of formation.

The present inventors have found that the low optical density spot can be minimized by employing a base paper sheet having the above-defined uniform distribution of formation. The above-defined base paper sheet has substantially no wild formation. The wild formation causes lack of uniformity or evenness with respect to the pressure in image transfer process, especially in the case that the image is transferred under low pressure, or that the original has a gradation. Therefore, the low optical density spots in the image have been formed on the image-receiving material.

The light-sensitive material of the invention gives an improved clear image in which the occurrence of the low optical density spots in the image formation are minimized or reduced under low pressure, because the paper support employs the base paper sheet having the uniform distribution of formation, namely substantially no wild formation.

In the embodiment wherein the silver halide and polymerizable compound are cotained in microcapsules, or the embodiment wherein the photo polymerizable composition or photo polymerizable compound is contained in microcapsules, unhardened microcapsules, in which the polymerizable compound is unpolymerized, are ruptured under pressure to transfer the unpolymerized polymerizable compound to the image-receiving material. Therefore, the occurrence of the low optical density spots is amplified in the embodiments employing the microcapsules, because the lack of the uniformity with respect to the pressure further causes an irregularity in the rupture of the microcapsules. In the light-sensitive material of the present invention, the irregularity in the rupture of the microcapsules is also reduced. Therefore, the effect of the invention is particularly remarkable in embodiments employing the microcapsules.

DETAILED DESCRIPTION OF THE INVENTION

The light-sensitive material of the present invention utilizes a paper support. The term "paper support" in the invention refers to a base paper sheet essentially composed of wood pulp (hereinafter referred to as "base paper sheet") or to a sheet comprising a coating layer provided on the base paper sheet.

The base paper sheet employable for the paper support used in the light-sensitive material of the present invention has such a distribution of formation that the total coefficient of variation (%) relating to the distribution curve of laser beam transmittance is not more than 15%. The distribution curve of laser beam transmittance is obtained by helium-neon laser scanning. In the present invention, the distribution curve of laser beam transmittance is measured using SHEET FORMATION TESTER (tradename of TOYO SEIKI SEISAKU-SHO, LTD.). The method for measurement using the SHEET FORMATION TESTER is described below.

The apparatus of SHEET FORMATION TESTER is composed of an optical system (light source, mirror, detecting element, etc.) and a measuring system (signal amplifier, signal converter, analyzer, analog-to-digital (A/D) converter, data processor, etc.)

As the light source, helium-neon laser ($\lambda = 632.8$ nm) is used. The laser beam converges through a collimation lens, and strikes a vibration mirror by way of a reflection mirror.

The laser beam is shifted right and left by the vibration mirror which vibrates according to a triangle wave having frequency of 6.25 Hz. The shifted laser beams are then vertically reflected in parallel with each other by a scanning mirror (arc mirror) to scan a surface of a sample paper placed on a stage which is moving back and forth.

The spot diameter of the scanning laser beam is about 0.1 mm. The laser beam vibrates in the range of 160 mm at a constant speed. The trace of the scanning laser beam becomes a triangle wave, because the stage is moving.

The laser beam is transmitted by the paper and then strikes a light receiving element (silicon photo cell).

The light receiving element converts variation of the transmitted light into an electric current. The wave of the detected signal becomes a complicated way including various frequency components corresponding to variation of the basis weight (i.e., wild formation) in the scanned area of the sample paper. This wave gives a formation signal. When the scanning rate of the beam spot "v" is determined, the wild formation can be represented by a wavelength "l". Therefore, the frequency "f" corresponding to the wavelength "l" can be determined by the following formula (I):

$$f = v/l \text{ (Hz)} \tag{I}$$

In the apparatus, the electric current corresponding to the formation signal which is obtained at the light receiving element is converted into a voltage, amplified, and corrected with respect to the level. The voltage signal is passed through filters which are arranged at an interval of one third octave in the range of 25 to 12,500 Hz. The size of the wild formation is represented by a wavelength value. Therefore, the signal is devided into the frequency components corresponding to the wavelength.

In the frequency analysis, the size of the wild formation is obtained at twenty eight points, 80 mm (25 Hz), 63 mm (31.5 Hz), 50 mm (40 Hz), 32 mm (63 Hz), 25 mm (80 Hz), 20 mm (100 Hz), 16 mm (125 Hz), 12.5 mm (160 Hz), 10 mm (200 Hz), 8 mm (250 Hz), 6.3 mm (315 Hz), 5 mm (400 Hz), 4 mm (500 Hz), 3.2 mm (630 Hz), 2.5 mm (800 Hz), 2 mm (1,000 Hz), 1.6 mm (1,250 Hz), 1.3 (1,600 Hz), 1 mm (2,000 Hz), 0.8 mm (2,500 Hz), 0.6 mm (3,150 Hz), 0.5 mm (4,000 Hz), 0.4 mm (5,000 Hz), 0.3 mm (6,300 Hz), 0.25 mm (8,000 Hz), 0.2 mm (10,000 Hz) and 0.16 mm (12,500 Hz). The variation of the transmitted light is converted into a digital signal and processed by a microcomputer.

The coefficient of variation $F_T(f_1)$, $F_T(f_2)$, ..., $F_T(f_{25})$ [$f_1=25$ Hz, $f_2=31.7$ Hz, ..., $f_{25}b=12,500$ Hz] can be determined by the following formula (II):

$$F_T = \sqrt{1/T \int_O^T \overline{(f(t)} - f(t))^2 \, dt / \overline{f(t)}} \quad \text{(II)}$$

In the formula (II), f(t) represents a light transmittance in an area on the surface of the paper.

The total coefficient of variation (TOTAL) relating to the wild formation (distribution curve of laser beam transmittance) can be determined by the following formula (III):

$$\text{TOTAL} = \sqrt{\sum_{i=80-0.16} [F_T(f_i)]^2} \quad \text{(III)}$$

In the present invention, the base paper sheet employed for the paper support has such a distribution of formation that the total coefficient of variation is not more than 15%. The total coefficient of variation is preferably not more than 10%.

The base paper sheet of the invention preferably has such distribution of formation that the total coefficient of variation relating to filtered waves is not more than 7%, said filtered waves being obtained by filtering the distribution curve of laser beam transmittance on the basis of the wavelengths of 12.5, 16, 20, 25, 32, 40, 50, 63 and 80 mm. The present inventors have further found that the low optical density spots are mainly caused by a wild formation having a wavelength of 12.5 to 80 mm. The total coefficient of variation relating to the filtered waves preferably is not more than 5%. The total coefficient of variation relating to the filtered waves (TOTAL') can be determined by the following formula (III'):

$$\text{TOTAL}' = \sqrt{\sum_{i=80-12.5} [F_T(f_i)]^2} \quad \text{(III')}$$

The methods for measurement using SHEET FORMATION TESTER are described in "Convertech" pp. 41–43 (March, 1986, written in Japanese) and the December number of the monthly "Keiso" Vol. 23 (extra edition, Whole Number 273, 1980, written in Japanese).

The constitution of the paper support used in the present invention and means of adjusting the distribution of formation to the above-mentioned definition are described below.

The base paper sheet employed for the paper support is mainly composed of a wood pulp. There is no specific limitation with respect to the wood pulp. Examples of the wood pulps include laubholz bleached kraft pulp (LBKP), nadelholz bleached kraft pulp (NBKP), laubholz bleached sulfite pulp (LBSP), nadelholz bleached sulfite pulp (NBSP), laubholz dissolving pulp (LDP), nadelholz dissolving pulp (NDP), laubholz unbleached kraft pulp (LUKP) and nadelholz unbleached kraft pulp (NUKP), LBKP, LBSP, NBSP, LDP and NDP are preferred, because they are mainly composed of short fibers. LBSP and LDP are more preferred because they can be beated to increase the content of short fibers. LBSP and/or LDP are preferably used in an amount of not less than 5 weight % based on the total amount of the pulp contained in the base paper sheet. However, in order to maintain the paper strength of the paper support hight, the amount of LBSP and/or LDP preferably is not more than 60 weight %.

The wood pulp can be partially replaced with a plant fiber pulp such as straw, esparto, bagasse, kenaf or the like; a synthetic pulp composed of polyethylene, polypropylene or the like; or a synthetic fiber composed of polyester, polyvinyl alcohol, nylon or the like.

The wood pulp is preferably beaten to have a Canadian standard freeness (CSF) as a whole in the range of from 200 to 400 cc, more preferably from 250 to 350 cc. The wood pulp can be beaten in a hollander, such as a beater, a conical refiner and a disk refiner hollander. Jordan type conical refiner is most preferred. In case that a conventional disk refiner is used, it is preferred to adjust the beating conditions, such as the beating plate, the rotational frequency of disk, the beating load, the density of beaten pulp and the amount of flowing pulp.

The base paper sheet preferably has a distribution of fiber length that the amount of residual pulp on 24 mesh screen and on 42 mesh screen is 30 to 60 weight % based on the total amount of the pulp contained in the base paper sheet. The distribution of fiber length can be adjusted using various means in the course of the above-stated process such as by selecting pulp in the paper stuff or by adjusting the method for beating of pulp. In the invention, the distribution of fiber length is defined by JIS(Japanese Industrial Standard)-P-8207. The amount of residual pulp on 24 mesh preferably is not more than 10 weight %.

The distribution of fiber length defined in JIS-P-8207 (method of screening test of paper pulp) is determined by the following manner. A sample of approx. 10 g in the absolute dry weight is fully disaggregated by standard disaggregator. The sample is then screened for 15 minutes using a screening test machine (commercially available by TOYO SEIKI SEISAKU-SHO, LTD.). Each of residual pulps on 24 mesh screen (nominal size: 710 μm), on 42 mesh screen (nominal size: 350 μm), on 80 mesh screen (nominal size 177 μm) and on 150 mesh screen (nominal size: 105 μm) is independently determined as a percentage (weight %) based on the total weight of the sample. Accordingly, when the amount of residual pulp on 24 mesh screen and on 42 mesh screen is small, the base paper sheet contains a small amount of long fiber.

A dispersing agent is preferably added to the base paper sheet. Examples of the dispersing agents include polyethyleneoxide, hydroxyethylcellulose and polyacrylamide.

A filler (e.g., calcium carbonate, talc, clay, kaolin, titanium dioxide and fine particles of urea resin), an internal size (e.g., rosin, paraffin wax, a salt of higher fatty acid, a salt of an alkenylsuccinic acid, a fatty acid anhydride and an alkylketene dimer), a paper strengthening agent (e.g., polyacrylamide, starch, polyvinyl alcohol and melamine-formaldehyde condensate), a softening agent (e.g., a reaction product of a maleic anhydride copolymer with a polyalkylene polyamine and a quarternary ammonium salt of a higher fatty acid), a fixing agent (e.g., aluminum sulfate and polyamide-polyamine-epichlorohydrin), a colored dye and- /or a fluorescent dye can be added to the base paper sheet in addition to the dispersing agent.

The base paper sheet can be prepared by Fourdrinier paper machine or Cylinder paper machine. Fourdrinier paper machine is preferred to Cylinder paper machine. The base paper sheet is preferably prepared using a shake in Fourdrinier paper machine. The base paper sheet is preferably under the condition that the J/W ratio (ratio of paper jet to wire speed) in the paper machine ranges from 0.9 to 1.0. The base paper sheet is preferably prepared using a dandy roll in the paper machine.

The base paper sheet preferably has a basis weight of 20 g/m$^2$ to 200 g/m$^2$, and more preferably 30 g/m$^2$ to 100 g/m$^2$. The thickness of the base paper sheet preferably ranges from 25 to 250 μm, and more preferably from 40 to 150 μm.

The base paper sheet can be passed through a calender such as on-machine calender in a paper machine or supercalender outside a paper machine to improve the smoothness. After having been calendered, the density (bulk density) of the base paper sheet preferably ranges from 0.7 to 1.2 g/m$^2$, and more preferably from 0.85 to 1.10 g/m$^2$, wherein the value is measured according to JIS-P-8118.

The distribution of formation can be adjusted to the above-mentioned definition using various means in the course of the above-stated process such as by adjusting the distribution of fiber length, by adding the dispersing agent or by selecting the paper machine.

The base paper sheet itself can be used as a paper support of the light-sensitive material of the invention. However, a coating layer containing a hydrophobic polymer is preferably provided on a side or both sides of the base paper sheet. The coating layer can comprises two or more layers, so long as at least one layer contains a hydrophobic polymer.

A conventional surface size can be coated on the surface of the base paper sheet prior to providing a coating layer on the base paper sheet. Examples of the surface size include polyvinyl alcohol, starch, polyacrylamide, gelatin, casein, styrene-maleic anhydride copolymer, alkylketene dimer, polyurethane and an epoxidized fatty acid amide.

The hydrophobic polymer contained in the coating layer preferably is a polymer having a glass transition point in the range of −20° to 50° C. The polymer can be a homopolymer or a copolymer. The copolymer may partially contain a hydrophilic repeating unit, so long as it is hydrophobic as a whole. Examples of the hydrophobic polymers include polyvinylidene chloride, styrene-butadiene copolymer, methyl methacrylate-butadiene copolymer, acrylonitrile-butadiene copolymer, styreneacrylate copolymer, methyl methacrylate-acrylate copolymer and styrene-methacrylate-acrylate copolymer.

The hydrophobic polymer preferably has a cross-linked structure. The cross-linked structure can be introduced into the hydrophobic polymer when a conventional hardening agent (crosslinking agent) is used together with the hydrophobic polymer in the course of the preparation of the paper support. Examples of the hardening agents include an active vinyl compound (e.g., 1,3-bis(vinylsulfonyl)-2-propanol, methylenebismaleimide), an active halogen compound (e.g., sodium salt of 2,4-dichloro-6-hydroxy-s-triazine, 2,4-dichloro-6-hydroxy-s-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane).

A pigment can be added to the coating layer to increase the smoothness of the surface of the coating layer and to facilitate the formation of the coating layer in the course of preparation. The pigment may be any of inorganic and organic pigments employed in the conventional coated paper (coat paper, art paper, baryta paper etc.). Examples of the inorganic pigments include titanium dioxide, barium sulfate, talc, clay, kaolin, calcined kaolin, aluminum hydroxide, amorphous silica and crystalline silica. Examples of the organic pigments include polystyrene resin, acrylic resin, urea-formaldehyde resin.

A waterproofing agent can be also added to the coating layer. Examples of the waterproofing agents include polyamidepolyamine-epichlorohydrin resin, polyamide-polyurea resin, glyoxal resin, etc. Resins containing no formaldehyde (e.g., polyamide-polyamine-epichlorohydrin resin and polyamide-polyurea resin) are particularly preferred.

The coating layer can be prepared by coating a solution on the surface of the base paper sheet. A latex in which the components such as the hydrophobic polymer, hardening agent, pigment and/or waterproofing agent are dissolved, dispersed or emulsified can be used as the coating solution. The coating solution can be coated on the base paper sheet according to any of the conventional coating methods such as dip coating method, air-knife coating method, curtain coating method, roller coating method, doctor coating method, gravure coating method, etc.

The coating layer is preferably provided on the base paper sheet in a coating amount of not less than 3 g/m$^2$ (total amount in the case that two or more layers are provided), and more preferably 5 to 30 g/m$^2$.

The paper support can be passed through a calender such as gloss calender or supercalender to increase the smoothness of the paper support simultaneously with or after coating the layer on the base paper sheet.

In the light-sensitive material of the invention, a light-sensitive layer is provided on the above-mentioned paper support. In an embodiment, the light-sensitive layer contains at least silver halide, a reducing agent and a polymerizable compound. In another embodiment, the light-sensitive layer contains at least a photo polymerizable composition or a photo polymerizable compound. Each of the components of the light-sensitive layer is described below.

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed in polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agents(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occured in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p-or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the image-forming method of the invention, a polymerizable compounds having a relatively higher boiling point (e.g., 80° C. or higher) is prebarably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amounts of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

A light-sensitive layer containing a photo polymerizable composition can be used instead of the light-sensitive layer containing silver halide, a reducing agent and polymerizable compound.

In the present invention, the photo polymerizable composition comprises a mixture of a photo polymerization initiator and a polymerizable compound. The polymerizable compound employable for the photo polymerizable composition is the same as the above-stated polymerizable compound.

Examples of the photo polymerization initiator include α-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, α-halo-α-phenylacetophenones, redox couples of photo reducible dye and reducing agent, paraffin halide (e.g., brominated paraffin, chlorinated paraffin), benzoyl alkyl ethers and lophine dimer-mercapto compound couples. Among them, aromatic ketones are preferred.

Concrete examples of the photo polymerization initiator include 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylxanthone, chlorosulfonylanthraquinone, chloromethylanthracene, chloromethylbenzothiazole, chlorosulfonylbenzoxazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis(θ-chlorophenyl)-4,4',5,5'-tetraphenylbiimidazole and 2-mercapto-5-methylthio-1,3,4-thiadiazole.

The photo polymerization initiator can be used singly or in combination of two or more compounds.

The photo polymerization initiator is preferably used in amount of 0.5 to 30 weight %, more preferably 2 to 20 weight %, based on the amount of the polymerizable compound.

Instead of the photo polymerizable composition, a photo polymerizable compound which itself has a photo polymerization property can be used.

Examples of the photo polymerizable compound include acrylamide, barium acrylate, glycerol triacrylate, N,N'-methylene bisacrylamide, polyethylene glycol diacrylate, pentaerythritol diacrylate, pentaerythritol triacrylate, vinylcarbazole and silicate ester of polyvinyl alcohol. A compound synthesized by introducing a light-sensitive group into the above-mentioned polymerizable compound can be also used as a photo polymerizable compound.

Various embodiments of the light-sensitive materials, optional components which may be contained in the light-sensitive layer, and auxiliary layers which may be optionally arranged on the light-sensitive materials are described below.

In the light-sensitive material of the invention, the polymerizable compound (the term, "polymerizable compound" includes the photo polymerizable composition and photo polymerizable compound) is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm.

In the case that silver halide grains are contained in the microcapsule, the silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

The light-sensitive material containing the above-mentioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977).

These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980).

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, reducing agent and polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, orr under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an anti-fogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $—SO_2—$ and/or $—CO—$ group described in U.S. Pat. No. 3,347,675; polar compounds described in U.S. Pat. No. 3,667,959; and 1,10-decanediol, methyl anisate and biphenyl suberate described in Research Disclosure 26–28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,374. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polyers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably has a pH value f not more than 7.

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelating and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

When the emulsion of the polymerizable compound (including the dispersion of the microcapsule) contains silver halide or the compound is a photo polymerizable compound, the emulsion can be used as the coating solution of the light-sensitive material. The coating solution can be also prepared by mixing the emulsion of the polymerizable compound with the silver halide emulsion, the photo polymerization initiator, or other components such as organic silver salt. The other components can be added during the stage of the preparation of the coating solution in a similar manner as the above emulsion.

The light-sensitive material of the invention can be prepared by coating and drying the above-prepared coating solution on a supprot. The process for coating the coating solution on a support can be easily carried out in the conventional manner.

An image-forming method employing the light-sensitive material is described below.

The light-sensitive material of the invention is imagewise exposed with light to form a polymer image on the light-sensitive material.

Various exposure means can be employed in the image-wise exposure, and in general, the latent image on the silver halide is obtained by imagewise exposure to radiation including visible light. The type of light source and exposure can be selected depending on the light-sensitive wavelengths (sensitized wavelength when seinsitization is carried out) or sensitivity of silver halide. Original image can be either monochromatic image or color image. In the case that the photo polymerizable composition or photo polymerizable compound is used, the polymerizable compound within the exposed area is polymerized.

In the case that the light-sensitive layer contains silver halide, a reducing agent and a polymerizable compound, development of the light-sensitive material can be conducted simultaneously with or after the image exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferaby from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

In the image forming method employing the light-sensitive material, the image is preferably formed on an image-receiving material. The image-receiving material is described hereinbelow.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing an image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$•cm/cm$^2$•sec•cmH can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the entire surface of the image-receiving layer. A layer containing a granulated thermoplastic compound can be also provided on the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewise exposing the light-sensitive material to form a latent image, a heat development device for fixing the area corresponding to the latent image, a transfer device for pressing the developed light-sensitive material on the image-receiving material. Another example of the apparatus comprises an fixing apparatus for irrasiating, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of paper support (a)

In a Jordan type conical refiner, 10 weight parts of laubholz bleached sulfite pulp (LBSP) and 90 weight parts of laubholz bleached kraft pulp (LBKP) were beaten to obtain a pulp having Canadian standard freeness of 280 cc. To the resulting pulp were added 1.0 weight part of rosin, 2.0 weight parts of aluminum sulfate and 0.5 weight part of polyamide-polyamine-epichlorohydrin to obtain a paper stuff, in which the part was a dry weight ratio to the pulp. A base paper sheet have basis weight of 50 g/m$^2$ and a thickness of 55 $\mu$m was prepared from the obtained paper stuff using Fourdrinier paper machine.

The distribution of fiber length of the residual pulp is 5.4 weight % on 24 mesh screen and 47.5 weight % on 42 mesh screen.

On the base paper sheet was coated a composition consisting of 300 parts of clay and 100 parts of latex of SBR (styrene-butadiene rubber) in the coating amount of 10 g/m$^2$.

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 $\mu$m and a bromide content of 80 mole %.

The emulsion was washed for desalting and then subjected to chemical sensitization with 5 mg of sodium thiosulfate and 20 mg of 4-hydroxy-6-methyl-1,3,3a,7-tetrazaindene at 60° C. Yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (tradename of Chiba-Geigy) and 2 g of Emulex NP-8 (tradename of Nippon Emulsion Co., Ltd.).

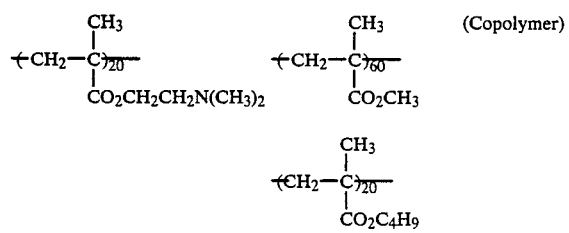

In 18.00 g of the solution was dissolved 0.002 g of the following thiol derivative.

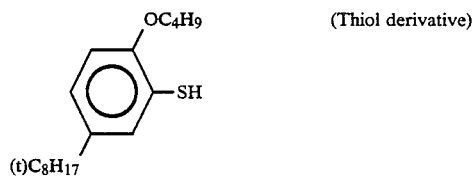

To the resulting solution was added a solution in which 0.16 g of the following reducing agent (I) and 1.22 g of the following reducing agent (II) are dissolved in 1.80 g of methylene chloride.

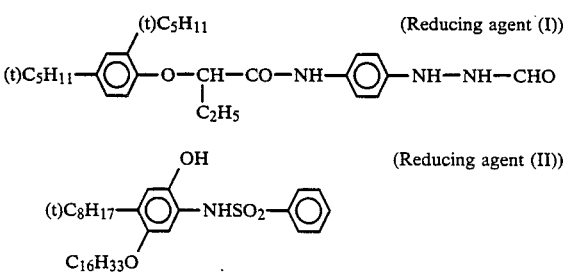

To the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename of Kuraray Co, Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of reorcinol, 8.56 g of 37% aqueous solution of formaldehyde and 3.00 g of 8.00% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

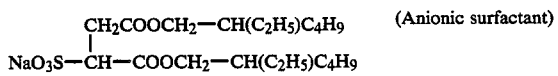 (Anionic surfactant)

The coating solution was uniformly coated on the surface of the coating layer of the paper support (a) using a coating rod of #40 to give a layer having wet thickness of 70 μm and dried at about 40° C. to obtain a light-sensitive material (A).

EXAMPLE 2

Preparation of paper supports (b) & (c)

Paper supports (b) and (c) were prepared in the same manner as in Example 1, except that the composition and Canadian Standard Freeness of the wood pulp were changed according to the following Table 1. The distribution of the fiber length (residual pulp on 24 mesh and on 42 mesh) and the distribution of the formation (sheet formation) are shown in Table 2.

TABLE 1

| Paper Support | Composition of Wood Pulp | (= Ratio %) | Freeness (cc) |
|---|---|---|---|
| (a) | LBSP + LBKP | (10 + 90) | 280 |
| (b) | LDP + LBKP | (30 + 70) | 310 |
| (c) | LBKP + LBSP + LDP | (50 + 20 + 30) | 250 |

TABLE 2

| Paper Support | Residual Pulp | | | Sheet Formation | |
|---|---|---|---|---|---|
| | 24 mesh | 42 mesh | Total | Total | 12.5–80 mm |
| (a) | 5.4% | 47.5% | 52.9% | 13.2% | 5.4% |
| (b) | 1.2% | 38.2% | 39.4% | 7.2% | 4.3% |
| (c) | 0% | 34.2% | 34.2% | 6.6% | 3.0% |

Preparation of light-sensitive material

Light-sensitive materials (B) and (C) were prepared in the same manner as Example 1, except that the paper supports (b) and (c) were respectively used.

COMPARISON EXAMPLE 1

Preparation of paper supports (x), (y) & (z)

Paper supports (x), (y) and (z) were prepared in the same manner as in Example 1, except that except that the composition and Canadian Standard Freeness of the wood pulp were changed according to the following Table 3. The distribution of the fiber length (residual pulp on 24 mesh and on 42 mesh) and the distribution of the formation (sheet formation) are shown in Table 4.

TABLE 3

| Paper Support | Composition of Wood Pulp | (= Ratio %) | Freeness (cc) |
|---|---|---|---|
| (x) | LBKP | (100) | 400 |
| (y) | LBKP + NBKP | (70 + 30) | 340 |
| (z) | LBKP + NBKP | (50 + 50) | 280 |

TABLE 4

| Paper Support | Residual Pulp | | | Sheet Formation | |
|---|---|---|---|---|---|
| | 24 mesh | 42 mesh | Total | Total | 12.5–80 mm |
| (x) | 14.2% | 50.8% | 65.0% | 18.9% | 9.2% |
| (y) | 21.3% | 52.9% | 74.2% | 20.3% | 11.5% |
| (z) | 28.4% | 55.3% | 83.7% | 24.1% | 11.9% |

Preparation of light-sensitive material

Light-sensitive materials (X), (Y) and (Z) were prepared in the same manner as Example 1, except that the paper supports (x), (y) and (z) were respectively used.

EXAMPLE 3

Preparation of light-sensitive material

A light-sensitive material (D) was prepared in the same manner as in Example 1, except that the silver benzotriazole emulsion was not used.

EXAMPLE 4

Preparation of light-sensitive material

To a monomer mixture of 2 g of trimethylolpropane triacrylate and 7 g of methylmethacrylate was added 0.7 g of 2-mercapto-5-methylthio-1,3,4-thiadiazole, and the resulting mixture was dispersed using ultrasonic wave hollander to obtain a solution. In the solution were dissolved 6 g of methylene chloride, 0.7 g of 4,4'-bis(diethylamino)benzophenone, 2,1 g of 2,2'-bis(o-chlorophenyl)-4,4',5,5'-tetraphenylimidazole and 2.1 g of 3-diethylamino-6-chloro-7-anilinofulorane to obtain an oil phase.

A mixture of 17.0 g of 10% aqueous solution of arabic gum, 18.8 g of 12% aqueous solution of isobutylene/maleic anhydride and 26.8 g of distilled water was adjusted to pH 3.5 using sulfric acid. To the mixture were added 4.6 g of urea and 0.6 g of resorcin, and in the resulting solution was emulsified and dispersed the oil phase. The average particle diameter of the oil droplets was 3 μm. To the mixture was added 12.9 g of 36% formaldehyde, and the mixture was heated at 60° C. while stirring. After 1 hour, to the mixture was added 9.0 g of 5% aqueous solution of ammonium sulfate, and the mixture was kept at 60° C. while stirring for 1 hour.

The resulting mixture was cooled and then adjusted to pH 7.0 using an aqueous solution of sodium hydroxide to obtain a microcapsule dispersion.

To 5 g of the microcapsule dispersion were added 1.53 g of 15% aqueous solution of polyvinyl alcohol, 3.47 g of disilled water and 0.57 g of starch to obtain a coating solution. The coating solution was coated on the surface of the coating layer of the paper support (a) using a coating rod of #10 and dried at 40° C. to obtain a light-sensitive material (E).

Preparation of image-receiving material

To 125 g of water was added 11 g of 4% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on a castcoated paper to give a layer having a wet thickness of 30 μm and dried to obtain an image-receiving material.

Evaluation of light-sensitive material

Each of the light-sensitive materials prepared in Examples 1 to 3 and Comparison Example 1 was exposed to light all over the light-sensitive layer using a tungsten lamp at 60 lux for 1 second, and then heated on a hot plate at 125° C. for 40 seconds. Each of the exposed and heated light-sensitive materials was then combined with the image-receiving material and passed through press rolls at pressure of 250 kg/cm$^2$ or 700 kg/cm$^2$ to obtain a magenta positive image on the image receiving material. The number of the low-density spots on the obtained image was observed with the naked eye.

The light-sensitive material (E) prepared in Example 4 was exposed to light using high pressure mercury lamp at 400 W for 1 second from a distance of 50 cm. The exposed light-sensitive materials was then combined with the image-receiving material and passed through press rolls at pressure of 250 kg/cm$^2$ or 700 kg/cm$^2$ to obtain a magenta positive image on the image receiving material. The density of the magenta positive image was evaluated by the naked eye.

The results are set forth in Table 5. In Table 5, each of the values represents number of the low-density spots having a diameter of not less than 1 mm observed within the circular area having a diameter of 4 cm in the color image.

TABLE 5

| Light-Sensitive Material | Paper Support | Residual Pulp (24 + 42) | Number of low-density spots (Pressure) | |
|---|---|---|---|---|
| | | | 250 kg/cm$^2$ | 700 kg/cm$^2$ |
| (A) | (a) | 52.9% | 100–300 | <10 |
| (B) | (b) | 39.4% | 10–100 | <10 |
| (C) | (c) | 34.2% | <10 | <10 |
| (X) | (x) | 65.0% | ≧300 | ≧300 |
| (Y) | (y) | 74.2% | ≧300 | ≧300 |
| (Z) | (z) | 83.7% | ≧300 | ≧300 |
| (D) | (a) | 52.9% | 100–300 | <10 |
| (E) | (a) | 52.9% | 100–300 | <10 |

It is apparent from the results in Table 5 that each of the light-sensitive materials according to the present invention is remarkably reduced in the occurrence of the low optical density spots having a relatively large diameter.

EXAMPLE 5

Preparation of paper support (f)

In a Jordan type conical refiner, 30 weight parts of laubholz bleached sulfite pulp (LBSP) and 70 weight parts of laubholz bleached kraft pulp (LBKP) were beaten to obtain a pulp having Canadian standard freeness of 300 cc. To the resulting pulp were added 1.0 weight part of rosin, 2.0 weight parts of aluminum sulfate and 0.5 weight part of polyamide-polyamine-epichlorohydrin to obtain a paper stuff, in which the part was a dry weight ratio to the pulp. A base paper sheet having basis weight of 70 g/m$^2$ and thickness of 70 μm was prepared from the obtained paper stuff using Fourdrinier paper machine which has a shake.

The distribution of formation was measured by SHEET FORMATION TESTER (tradename of TOYO SEIKI SEISAKU-SHO, LTD.). The total coefficient of variation relating to the distribution curve of laser beam transmittance was 11.5%. The total coefficient of variation relating to filtered waves (based on wavelengths of 12.5 to 80 mm) was 4.8%.

On the base paper sheet was coated a composition consisting of 300 parts of clay, 100 parts of latex of SBR (styrene-butadiene rubber) and 2 parts of polyamide polyurea in the coating amount of 12 g/m$^2$.

Preparation of light-sensitive composition

In 100 g of trimethylolpropane triacrylate were dissolved 0.40 g of the copolymer used in Example 1, 6.00 g of Pargascript Red I-6-B (tradename of Chiba-Geigy) and 2 g of Nonion NS-208 (tradename of Nippon Oils & Fats, Co., Ltd.).

In 18.99 g of the solution was dissolved 0.02 g of benzotriazole. To the resulting solution was added a solution in which 0.16 g of the reducing agent (I) used in Example 1 and 1.22 of the reducing agent (II) used in Example 1 are dissolved in 1.80 g of methylene chloride.

To the resulting solution was added 3.50 g of the silver halide emulsion used in Example 1, and the mixture was stirred at 15,000 r.p.m. for 5 minutes to obtain a light-sensitive composition.

Preparation of light-sensitive microcapsule

A light-sensitive microcapsule dispersion was prepared in the same manner as in Example 1, except that the above-prepared light-sensitive composition was used.

Preparation of light-sensitive material

A light-sensitive material (F) was prepared in the same manner as in Example 1, except that the above-prepared light-sensitive microcapsule dispersion and the paper support (f) were used.

EXAMPLE 6

Preparation of paper supports (g) & (h)

Paper supports (g) and (h) were prepared in the same manner as in Example 5, except that the composition and Canadian Standard Freeness of the wood pulp, and the paper machine are changed according to the following Table 6. The distribution of the fiber length (residual pulp on 24 mesh and on 42 mesh) and the distribution of the formation (sheet formation) will be shown in Table 7.

Preparation of light-sensitive material

Light-sensitive materials (G) and (H) were prepared in the same manner as Example 5, except that the paper supports (g) and (h) were respectively used.

COMPARISON EXAMPLE 2

Preparation of paper supports (o), (p) and (q)

Paper supports (o), (p) and (q) were prepared in the same manner as in Example 5, except that the composition and Canadian Standard Freeness of the wood pulp, and the paper machine are changed according to the following Table 6. The distribution of the fiber length (residual pulp on 24 mesh and on 42 mesh) and the distribution of the formation (sheet formation) will be shown in Table 7.

Preparation of light-sensitive material

Light-sensitive materials (O), (P) and (Q) were prepared in the same manner as Example 1, except that the paper supports (x), (y) and (z) were respectively used.

TABLE 6

| Paper Support | Composition of Wood Pulp (= Ratio) | Refiner | Freeness (cc) |
|---|---|---|---|
| (f) | LBSP + LBKP (30% + 70%) | Konical | 300 |
| (g) | LBSP + NBSP (40% + 60%) | Konical | 270 |
| (h) | LDP + LBKP (40% + 60%) | Double Disk | 310 |
| (o) | LBKP + NBKP (40% + 60%) | Double Disk | 390 |
| (p) | LBKP + NBSP (50% + 50%) | Double Disk | 460 |
| (q) | LBKP (100%) | Double Disk | 420 |

| Paper Support | Shake | J/W Ratio | Dandy roll |
|---|---|---|---|
| (f) | (+) | 1.03 | (−) |
| (g) | (+) | 0.96 | (+) |
| (h) | (+) | 1.00 | (+) |
| (o) | (+) | 1.10 | (−) |
| (p) | (−) | 0.90 | (−) |
| (q) | (−) | 1.20 | (−) |

Remark: "Shake" and "Dandy roll" indicates whether the shake or the dandy roll was used (+) or was not used (−).

TABLE 7

| Paper Support | Residual Pulp | | | Sheet Formation | |
|---|---|---|---|---|---|
| | 24 mesh | 42 mesh | Total | Total | 12.5–80 mm |
| (f) | 0.5% | 49.5% | 50.0% | 11.3% | 4.8% |
| (g) | 1.2% | 42.3% | 43.5% | 9.8% | 3.9% |
| (h) | 0% | 39.6% | 39.6% | 7.2% | 3.1% |
| (o) | 12.2% | 54.1% | 66.3% | 20.3% | 11.2% |
| (p) | 8.1% | 48.3% | 56.4% | 19.1% | 9.2% |
| (q) | 1.8% | 49.1% | 50.9% | 17.8% | 8.7% |

EXAMPLE 7

Preparation of light-sensitive material

Light-sensitive material (I) was prepared in the same manner as in Example 4, except that the paper support (f) was used in place of the paper support (a).

Evaluation of light-sensitive material

Each of the light-sensitive materials prepared in Examples 5 and 6 and Comparison Example 2 was exposed to light all over the light-sensitive layer using a tungsten lamp at 60 lux for 1 second, and then heated on a hot plate at 125° C. for 40 seconds. Each of the exposed and heated light-sensitive materials was then combined with the image-receiving material and passed through press rolls at pressure of 250 kg/cm$^2$ or 500 kg/cm$^2$ to obtain a magenta positive image on the image receiving material. The number of the low-density spots on the obtained image was observed with the naked eye.

The light-sensitive material (I) prepared in Example 7 was exposed to light using high pressure mercury lamp at 400 W for 1 second from a distance of 50 cm. The exposed light-sensitive material was then combined with the image-receiving material and passed through press rolls at pressure of 250 kg/cm$^2$ or 500 kg/cm$^2$ to obtain a magenta positive image on the image receiving material. The number of the low-density spots on the obtained image was observed with the naked eye.

The results are set forth in Table 8. In Table 8, each of the values represents number of the low-density spots having a diameter of not less than 1 mm observed within the circular area having a diameter of 4 cm in the color image.

TABLE 8

| Light-Sensitive Material | Paper Support | Distribution of formation | Number of low-density spot (Pressure) | |
|---|---|---|---|---|
| | | | 250 kg/cm$^2$ | 500 kg/cm$^2$ |
| (F) | (f) | 11.3% | 200–300 | <20 |
| (G) | (g) | 9.8% | 100–200 | <20 |
| (H) | (h) | 7.2% | 100–200 | <20 |
| (O) | (o) | 20.3% | ≧300 | ≧300 |
| (P) | (p) | 19.1% | ≧300 | ≧300 |
| (Q) | (q) | 17.8% | ≧300 | ≧300 |
| (I) | (f) | 7.2% | 100–200 | <20 |

It is apparent from the results in Table 8 that each of the light-sensitive materials according to the present invention is remarkably reduced in the occurrence of the low optical density spots having a relatively large diameter.

We claim:

1. A light-sensitive material comprising a light-sensitive layer containing silver halide, a reducing agent and an ethylenically unsaturated polymerizable compound provided on a paper support, wherein the paper support employs a base paper sheet having:
   such a distribution of formation that the total coefficient of variation relating to the distribution curve of laser beam transmittance is not more than 15%, said distribution curve of laser beam transmittance being obtained by helium-neon laser scanning;
   such a distribution of fiber length that the amount of residual pulp on 24 mesh screen and on 42 mesh screen is in the range of 30 to 60 weight % based on the total amount of the pulp contained in the base paper sheet; and
   a density in the range of 0.85 to 1.10 g/m$^2$.

2. The light-sensitive material as claimed in claim 1, wherein the base paper sheet has such a distribution of formation that the total coefficient of variation relating to filtered waves is not more than 7%, said filtered waves being obtained by filtering the distribution curve of laser beam transmittance at wavelengths of 12.5, 16, 20, 25, 32, 40, 50, 63 and 80 mm.

3. The light-sensitive material as claimed in claim 1, wherein the base paper sheet has such a distribution of fiber length that the amount of residual pulp on 24 mesh screen is not more than 10 weight % based on the total amount of the pulp contained in the base paper sheet.

4. The light-sensitive material as claimed in claim 1, wherein the base paper sheet contains at least one pulp selected from the group consisting of a laubholz bleached sulfite pulp and a laubholz dissolving pulp in an amount of 5 to 60 weight % based on the total amount of pulp contained in the base paper sheet.

5. The light-sensitive material as claimed in claim 1, wherein the base paper sheet contains pulp which has a Canadian standard freeness of 200 to 400 cc as a whole.

6. The light-sensitive material as claimed in claim 1, wherein the base paper sheet has been prepared using a shake in Fourdrinier paper machine.

7. The light-sensitive material as claimed in claim 1, wherein the base paper sheet has been prepared under the condition that the ratio of paper jet to wire speed in a paper machine ranges from 0.9 to 1.0.

8. The light-sensitive material as claimed in claim 1, wherein the base paper sheet has been prepared using a dandy roll in a paper machine.

9. The light-sensitive material as claimed in claim 1, wherein the paper support comprises a coating layer containing a hydrophobic polymer provided on a side or both sides of a base paper sheet.

10. The light-sensitive material as claim in claim 1, wherein the silver halide and ethylenically unsaturated polymerizable compound are contained in microcapsules which are dispersed in the light-sensitive layer.

11. The light-sensitive material as claimed in claim 1, wherein the light-sensitive layer contains a color forming substance.

12. A light-sensitive material comprising a light-sensitive layer containing a photo polymerizable composition or an ethylenically unsaturated photo polymerizable compound provided on a paper support, said photo polymerizable composition comprising a photo polymerization initiator and an ethylenically unsaturated polymerizable compound, wherein the paper support employs a base paper sheet having:
 such a distribution of formation that the total coefficient of variation relating to the distribution curve of laser beam transmittance is not more than 15%, said distribution curve of laser beam transmitttance being obtained by helium-neon laser scanning;
 such a distribution of fiber length that the amount of residual pulp on 24 mesh screen and on 42 mesh screen is in the range of 30 to 60 weight % based on the total amount of the pulp contained in the base paper sheet; and
 a density in the range of 0.85 to 1.10 g/m$^2$.

13. The light-sensitive material as claimed in claim 12, wherein the base paper sheet has such a distribution of formation that the total coefficient of variation relating to filtered waves is not more than 7%, said filtered waves being obtained by filtering the distribution curve of laser beam transmittance at wavelengths of 12.5, 16, 20, 25, 32, 40, 50, 63 and 80 mm.

14. The light-sensitive material as claimed in claim 12, wherein the base paper sheet has such a distribution of fiber length that the amount of residual pulp on 24 mesh screen is not more than 10 weight % based on the total amount of the pulp contained in the base paper sheet.

15. The light-sensitive material as claimed in claim 12, wherein the base paper sheet contains at least one pulp selected from the group consisting of a laubholz bleached sulfite pulp and a laubholz dissolving pulp in an amount of 5 to 60 weight % based on the total amount of pulp contained in the base paper sheet.

16. The light-sensitive material as claimed in claim 12, wherein the base paper sheet contains pulp which as a Canadian standard freeness of 200 to 400 cc as a whole.

17. The light-sensitive material as claimed in claim 12, wherein the base paper sheet has been prepared using a shake in Fourdrinier paper machine.

18. The light-sensitive material as claimed in claim 12, wherein the base paper sheet has been prepared under the condition that the ratio of paper jet to wire speed in a paper machine ranges from 0.9 to 1.0.

19. The light-sensitive material as claimed in claim 12, wherein the base paper sheet has been prepared using a dandy roll in a paper machine.

20. The light-sensitive material as claimed in claim 12, wherein the paper support comprises a coating layer containing a hydrophobic polymer provided on a side or both sides of a base paper sheet.

21. The light-sensitive material as claimed in claim 12, wherein the photo polymerizable composition or photo polymerizable compound is contained in microcapsules which are dispersed in the light-sensitive layer.

22. The light-sensitive material as claimed in claim 12, wherein the light-sensitive layer contains a color image forming substance.

* * * * *